United States Patent [19]
Tobita

[11] Patent Number: 5,812,015
[45] Date of Patent: Sep. 22, 1998

[54] BOOSTING PULSE GENERATION CIRCUIT FOR A SEMICONDUCTOR INTEGRATED CIRCUIT

[75] Inventor: Youichi Tobita, Tokyo, Japan

[73] Assignee: Mitsubishi Denki Kabushiki Kaisha, Tokyo, Japan

[21] Appl. No.: 763,119

[22] Filed: Dec. 10, 1996

[30] Foreign Application Priority Data

Dec. 11, 1995 [JP] Japan ................................. 7-321760

[51] Int. Cl.⁶ .................................................. H03K 3/01
[52] U.S. Cl. ......................... 327/534; 327/390; 327/536; 327/589; 363/60
[58] Field of Search .................................. 327/534, 535, 327/536, 544, 390, 589; 363/59, 60

[56] References Cited

U.S. PATENT DOCUMENTS

| Re. 34,290 | 6/1993 | Tobita ........................ 323/313 |
| 3,805,095 | 4/1974 | Lee et al. ..................... 327/543 |
| 4,559,548 | 12/1985 | Iizuka et al. ................. 257/299 |
| 4,692,689 | 9/1987 | Takemae ...................... 323/313 |
| 4,820,936 | 4/1989 | Veendrick et al. ............ 327/534 |
| 5,160,860 | 11/1992 | Runaldue ..................... 327/589 |
| 5,184,030 | 2/1993 | Chung et al. ................. 327/534 |
| 5,394,365 | 2/1995 | Tsukikawa .................... 327/534 |
| 5,513,091 | 4/1996 | Uchida et al. ................ 327/536 |
| 5,621,348 | 4/1997 | Furutani et al. .............. 327/536 |

FOREIGN PATENT DOCUMENTS

| 57-157315 | 9/1982 | Japan . |
| 62-58669 | 4/1987 | Japan . |

OTHER PUBLICATIONS

Streetman, "Solid State Electronic Devices", 2nd Ed, Prentice–Hall, Inc., pp. 314–319, 1980.

*Primary Examiner*—Kenneth B. Wells
*Attorney, Agent, or Firm*—McDermott, Will & Emery

[57] ABSTRACT

A boosting pulse generating circuit includes a first inverter circuit connected between a first potential node and a second potential node and receives an input signal. A second inverter circuit, connected between the first potential node and the second potential node through a diode connected MOS transistor, is connected to an input terminal and an output terminal. A capacitor is connected between an output terminal of the first inverter circuit and a node interconnecting the diode connected MOS transistor and second inverter circuit. A back gate of the MOS transistor is connected to the gate thereof. This circuit produces good performance even when powered by a low voltage source of operating potential.

8 Claims, 6 Drawing Sheets $V_{th}=V_o+K(\sqrt{2\phi_F+V_{BS}}-\sqrt{2\phi_F})$

BOOSTING PULSE GENERATION CIRCUIT FOR A SEMICONDUCTOR INTEGRATED CIRCUIT

BACKGROUND OF THE INVENTION

1. Field of the Invention

The present invention relates to a semiconductor integrated circuit and, more particularly, to a novel boosting pulse generation circuit utilizing the threshold voltage of a diode-connected MOS transistor.

2. Description of Prior Art

Due to the wide and rapid spread of portable equipment such as notebook-type personal computers, cellular phones, personal handy phones, etc., there is an increasing demand for semiconductor integrated circuit having low power consumption. One method for achieving low power consumption has been to operate a semiconductor integrated circuit with a power source of low voltage. But driving a semiconductor integrated circuit with a low voltage power source causes a disadvantage to arise. The ratio of a voltage drop imported by the threshold voltage of a MOS transistor to a source potential is large, making it difficult to achieve a potential adjustment utilizing the threshold imported voltage drop seriously affecting the design of the circuit.

FIG. 7 is a circuit diagram of a conventional boosting pulse generation circuit described in Japanese utility model publication sho 61-166627.

A reference potential node 1 is connected to a source of ground potential VSS, and a reference potential node 3 is connected to a source of operating power potential Vcc. Output node 8 is a terminal for generating a boosting pulse OUT and input node 14 is a terminal for receiving an input signal which changes from a high level to a low level as shown in FIG. 8(*a*). Between power source potential node 3 and the ground potential node 1, an inverter circuit 2, which comprises P channel MOS transistor 17 and N channel MOS transistor 18, is connected. Input terminal 13 of inverter 2 is connected to input node 14 and output terminal 4 of inverter 2 is connected to node 7 through capacitor 6. A diode is connected between the power source potential node 3 and node 7. Between node 7 and ground potential node 1, inverter circuit 16, which comprises P channel MOS transistor 19 and N channel MOS transistor 20, is connected. Input terminal of inverter 16 is connected to input node 14 and output terminal of inverter 16 is connected to output node 8.

Operation of the conventional boosting pulse generation circuit shown in FIG. 7 is described with reference to the timing chart of FIG. 8. When the input signal IN is at a high level, P MOS transistor 17 is turned off and N MOS transistor 18 is turned on, and the output of the inverter 2 is at a low level. Likewise, since P MOS transistor 19 is turned off and N MOS transistor 20 is turned on, the output of inverter 16 is kept at a low level. At this moment, capacitor 6 is charged from the power source potential Vcc through diode 5 and transistor 18. As a result, the voltage potential of node 4 is zero and the voltage potential V7 of node 7 is the voltage shown in the following equation.

$$V7 = Vcc - Vf = Vcc - 0.7$$

Next, when the input signal IN is changed from a high level to a low level, transistor 17 is turned on and transistor 18 is turned off, and the voltage of node 4 rises to Vcc. As a result, the voltage potential V7 of node 7 rises as illustrated by the following equation.

$$V7 = Vcc - Vf + Vcc = 2Vcc - Vf$$

Due to the change of the input signal IN, transistor 19 turns on and transistor 20 turns off, the voltage of node 7 transferring to output terminal 8. Therefore, the voltage potential V8 of node 8 is expressed by the following equation.

$$V8 = V7 = 2Vcc - Vf$$

Generally, the circuit for performing such an operation is called a boosting pulse generation circuit. However, when using a low voltage power source such as 1.5 to 2.0 V, generally having a threshold voltage |Vth| of the MOS transistors around 0.7V or so, the voltage drop of the MOS transistor occupies a significant percentage of the source voltage, resulting in low efficiency.

SUMMARY OF THE INVENTION

In the conventional boosting pulse generation circuits described above, a problem exists in that the percentage of the threshold voltage |Vth| of the MOS transistor with respect to the source voltage VCC, is large. This is particularly true at the time of operation with a low voltage power source, and hence performance of the boosting pulse generation circuit is very poor.

The present invention was made to solve the above-discussed problem. An object of the invention is to provide a boosting pulse generation circuit of high performance with respect to source voltage, particularly in operation with a low voltage power source.

Another object of the invention is to provide a boosting pulse generation circuit capable of rapidly generating a predetermined potential.

A further object of the invention is to provide a boosting pulse generation circuit capable of increasing operation margin in the circuit driven thereby.

According to a general aspect of the invention, a boosting pulse generating circuit comprises a first inverter circuit connected between a first potential node and a second potential node and receiving an input signal at an input terminal. A second inverter circuit, connected between the first potential node and the second potential node through a diode connected MOS transistor, is connected to the input terminal and to an output terminal. A capacitor is connected between an output terminal of the first inverter circuit and a node interconnecting the diode and second inverter circuit. A back gate of the diode-connected MOS transistor is connected to the gate thereof.

DETAILED DESCRIPTION OF THE PREFERRED EMBODIMENTS

Figure 1:
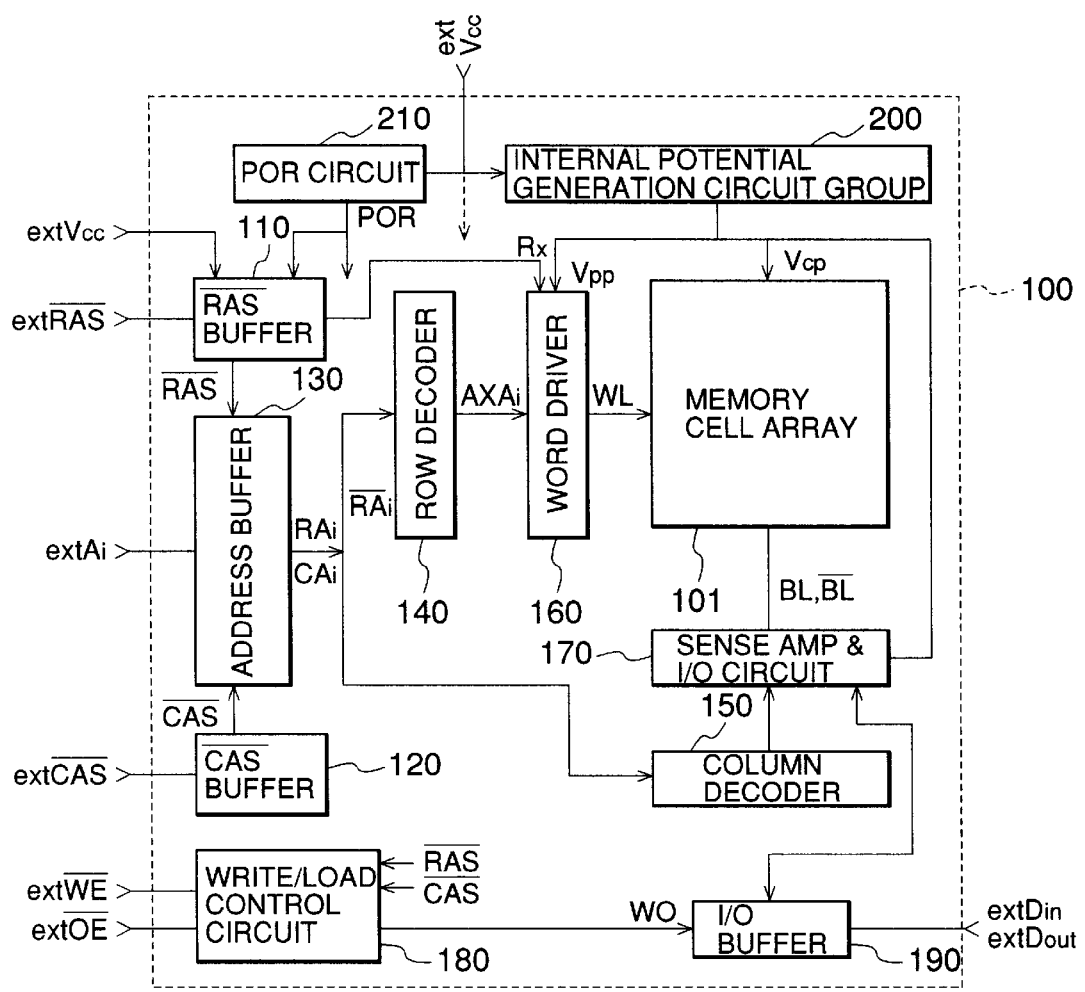
FIG. 1 is a block diagram of a DRAM in which the present invention is applied.

FIG. 1 shows a block diagram of the DRAM (Dynamic Random Access Memory) 100 in which the invention is applied, including an internal potential generation circuit group 200, POR (Power On Reset) circuit 210 and a memory cell array 101 comprised of a plurality of memory cells arranged in a plurality of rows and columns. /RAS (Row Address Strobe) buffer 110 receives an external /RAS signal applied from the outside and outputs the /RAS signal to address buffer 130; and /CAS (Column Address Strobe) buffer 120 receives an external /CAS signal applied from the outside and outputs a /CAS signal to address buffer 130. Address buffer 130 receives an external address signal ext Ai (i=0, 1, 2 , , , ) and the /RAS signal, latches the external address signal ext Ai, outputs row address signals RAi and /RAi for the internal circuit, and receives the external address signal ext Ai (i=0, 1, 2 , , , ) and the /CAS signal, latches the external address signal ext Ai, and outputs column address signals CAi and /CAi for the internal circuit.

Row decoder numeral 140 receives the row address signals RAi and /RAi from address buffer 130 and selects a corresponding word line; column decoder 150 receives the CAi and /CAi signals from address buffer 130 and selects a corresponding sense amplifier and I/O circuit 170 which amplifies a potential of memory cell 101 read out on a bit line, and transfers data of memory cell 101 read out on the bit line. Numeral 160 designates a word driver for boosting a potential of the word line selected by the row decoder 140; 180 designates a write and read control circuit which receives a write enable signal ext/WE and an output enable signal ext/OE applied from the outside, and outputs a signal WO for controlling read and write of the internal circuit; and 190 designates an I/O buffer which receives the signal WO from write and read control circuit 180, transfers data ext Din applied from the outside to the sense amplifier and I/O circuit 170 through a data line in case of a write, and outputs data read out from the memory cell through the sense amplifier and I/O circuit 170 and the data line to the I/O pin as data ext Dout in case of read out.

Figure 3:
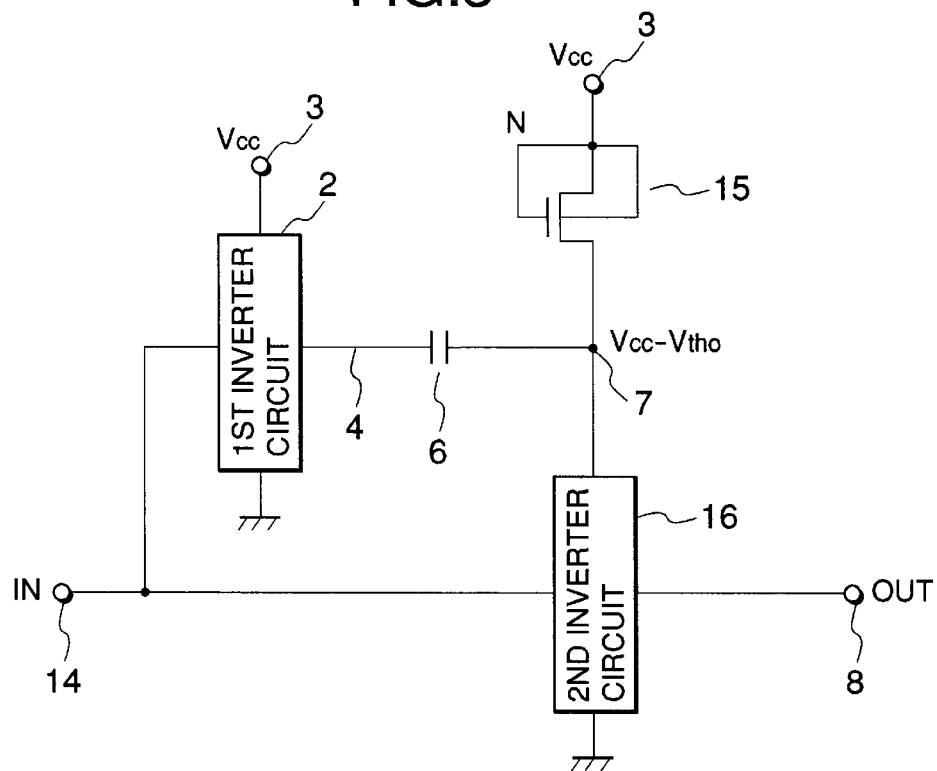
FIG. 3 is a circuit diagram showing a boosting pulse generation circuit according to an embodiment of the invention.
Figure 4:
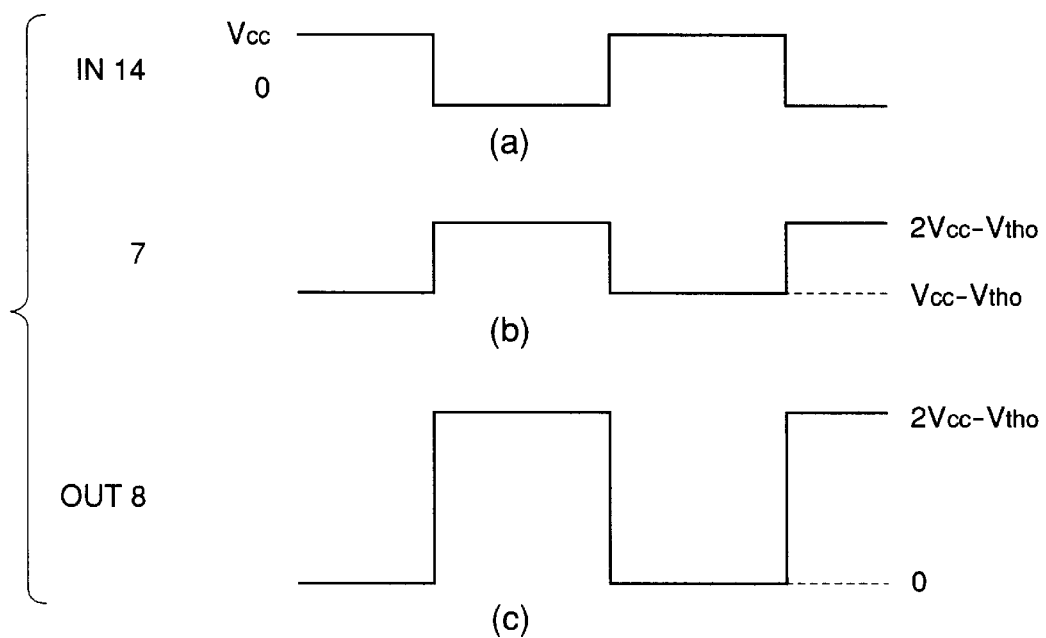
FIG. 4 is a timing chart showing operation of the VBB generation circuit according to the invention.
Figure 7:
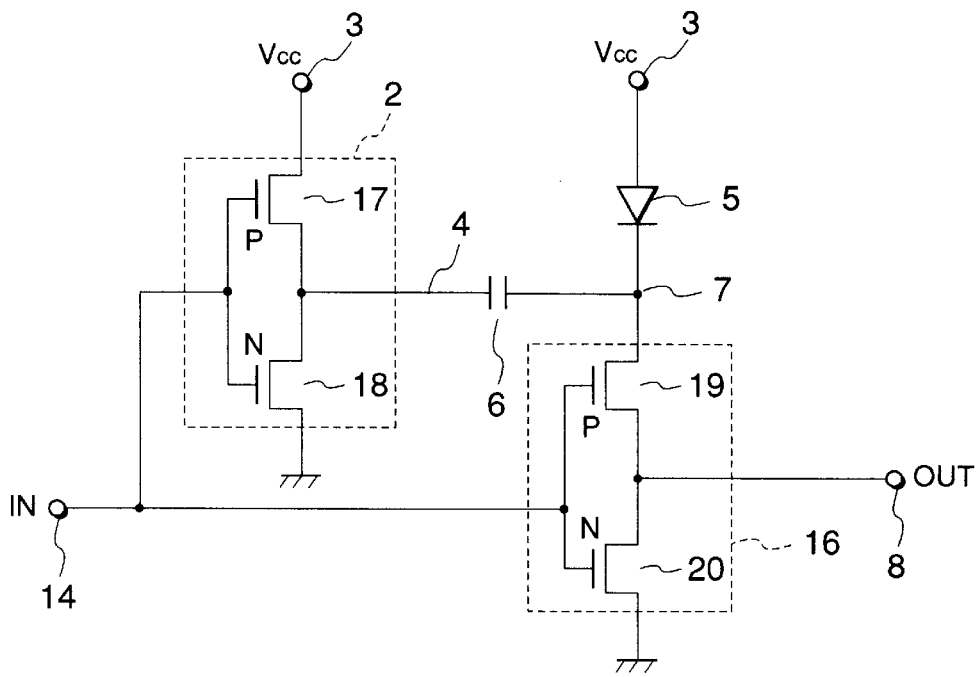
FIG. 7 is a circuit diagram showing a boosting pulse generation circuit according to the prior art.
Figure 8:
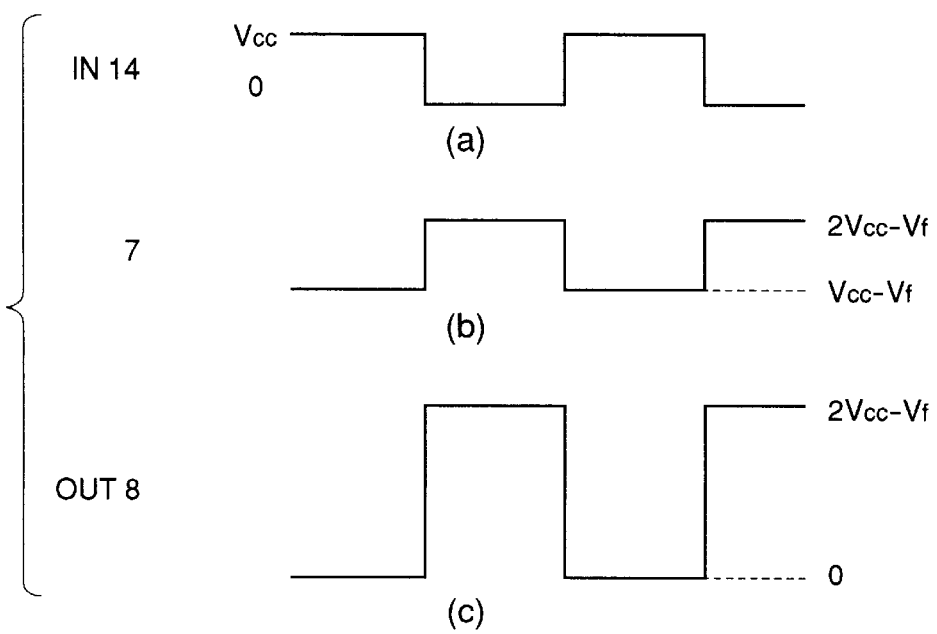
FIG. 8 is a timing chart showing operation of the boosting pulse generation circuit according to the prior art.

FIG. 3 is a schematic diagram of boosting pulse generation circuit 194 showing a preferred embodiment of this invention, and FIG. 4 is a timing chart showing operation thereof. In FIG. 3, the boosting pulse generation circuit is different from the conventional one shown in FIG. 7 in that the diode is replaced to by diode connected MOS transistor 15 in which a back gate is connected to the gate thereof. The MOS transistor may be either a N channel MOS transistor or a P channel MOS transistor.

Figure 2:
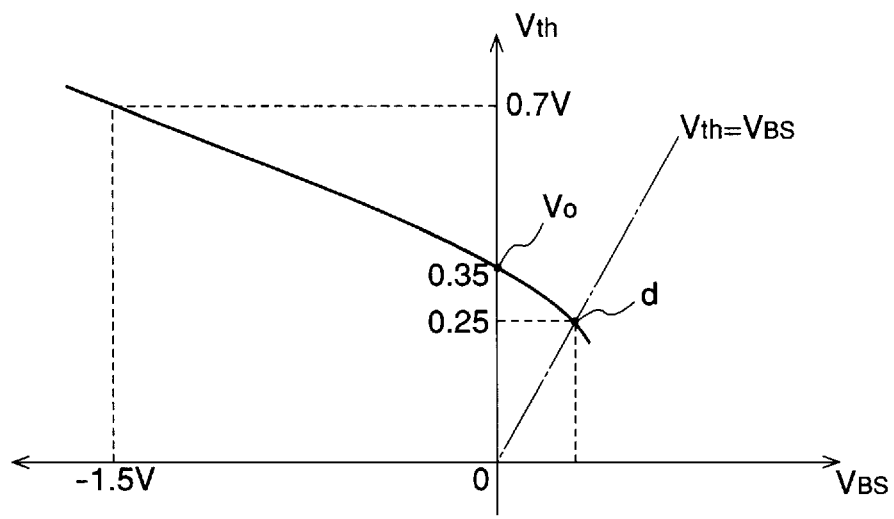
FIG. 2 is a graph showing a characteristic of the threshold voltage of a MOS transistor with respect to voltage between the back gate and the source according to the invention.

The threshold voltage of the MOS transistor, in which a back gate is connected to a gate, is hereinafter described with reference to FIG. 2. FIG. 2 is a graph showing schematically a fluctuation in the threshold voltage Vth of the MOS transistor with respect to a potential difference VBS between the back gate and source of the MOS transistor. The potential difference is shown in the following expression (1).

$$Vth = V0 + K[(2\phi F + VBS)^{1/2} - (2\phi F)^{1/2}] \quad (1)$$

wherein: VBS indicates a back gate voltage (on the basis of source voltage), K indicates a body effect constant, and $\phi F$ indicates a surface potential, and V0 indicates a threshold voltage when VBS=0V.

In the graph of FIG. 2, (d) indicates a point at which the potential difference VBS between the back gate and source of the MOS transistor is equal to the threshold voltage Vth of the MOS transistor. In the conventional case of VBS= 1.5V, the threshold voltage equals 0.7V ($V_{th}$=0.7V). By connecting the back gate and the gate, as shown in FIG. 2 of the present invention, the threshold voltage is reduced to 0.25V and $V_{BS}=V_{th}$. This reduced voltage is 0.1V less than the typical MOS transistor circuit where $V_{BS}$=0V and $V_{th}$=0.35V. In the description given hereinafter, for the sake of distinction, |Vth0| indicates an absolute value of the threshold voltage of the MOS transistor at the moment of connecting the back gate and the gate, while |Vth| indicates the conventional threshold voltage of VBS0=−1.5V.

Operation of the boosting pulse generation circuit shown in FIG. 3 is now described with reference to the timing chart of FIG. 4. In FIG. 4, (a) indicates a fluctuation in the potential of the input signal IN, (b) indicates a fluctuation in the potential of the node 7, and (c) indicates a fluctuation in the boosting output OUT of output node 8 of the boosting pulse generation circuit shown in FIG. 3.

First, when the input signal IN comes up from the VSS level to the VCC level, the operation of the inverter circuits 2 and 16 are the same as a conventional circuit. Due to the difference in the value of the threshold voltage, the voltage potential of node 7 and output node 8 are different respectively from the conventional circuit. As a result, a boosted pulse with a large voltage amplitude is generated.

Figure 5:
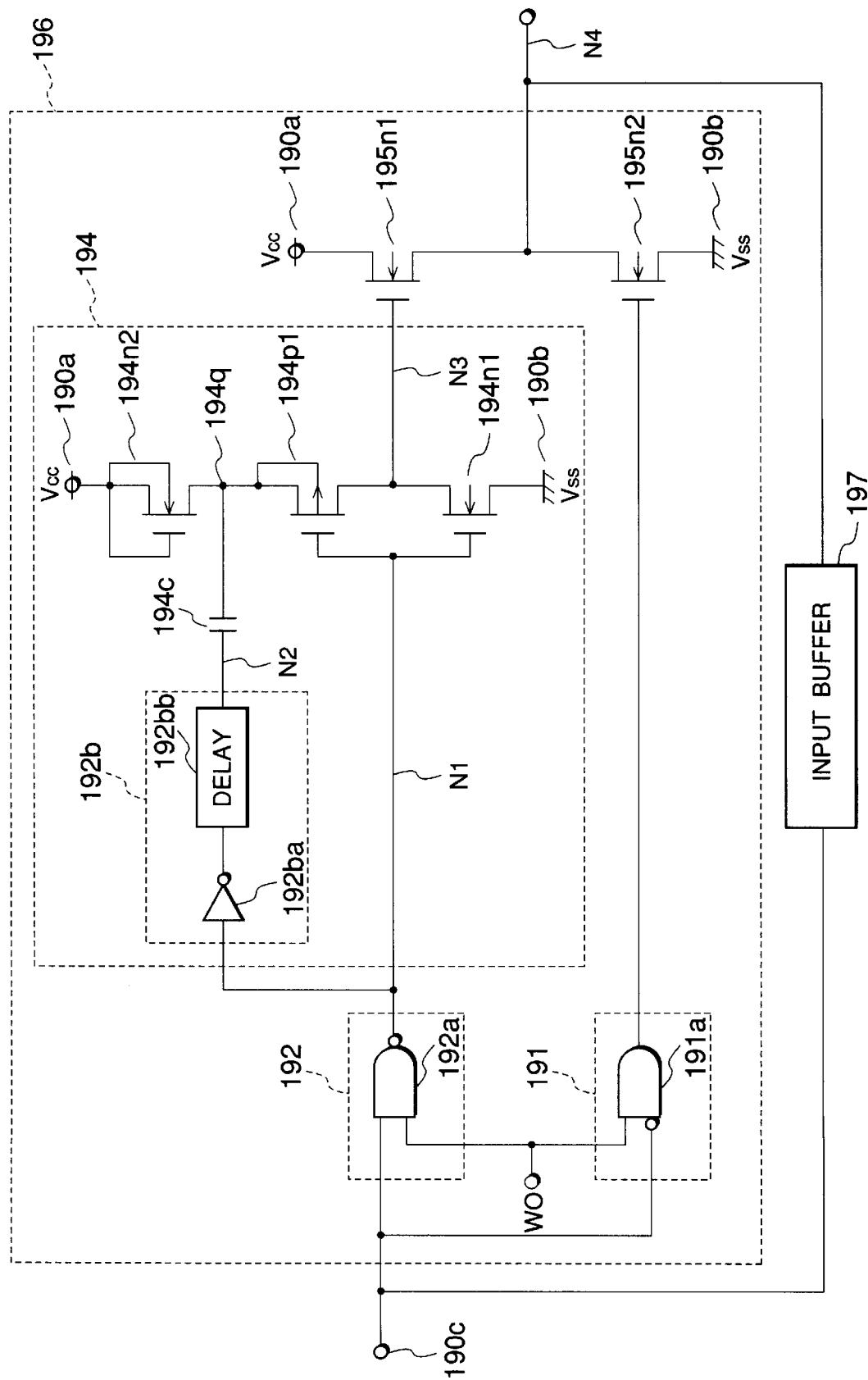
FIG. 5 is a circuit diagram showing a modified example of the boosting pulse generation circuit according to the invention.
Figure 6:
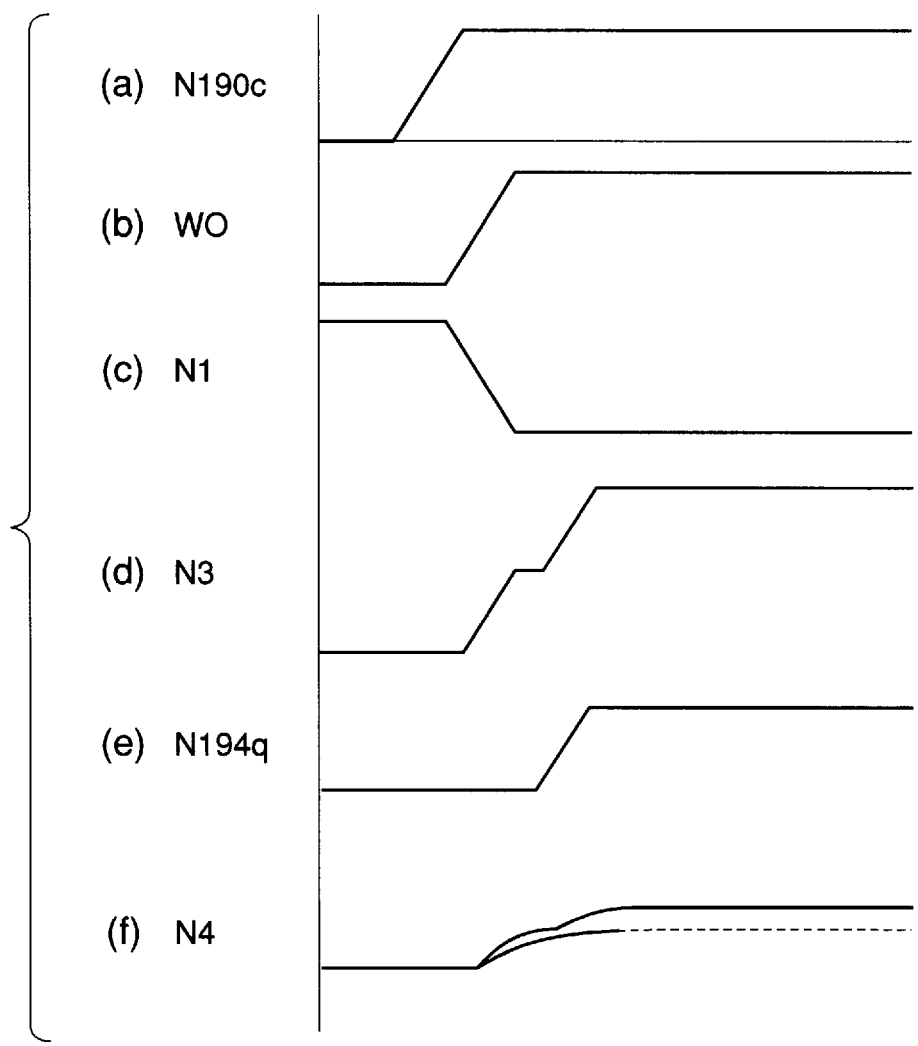
FIG. 6 is a timing chart showing operation of the boosting pulse generation circuit according to the invention.

FIG. 5 shows a detailed circuit diagram of input/output buffer 190 indicated in FIG. 1, in which a boosting pulse generation circuit is incorporated. FIG. 6 is a timing chart showing the operation of the circuit. In FIG. 5, input/output buffer 190 is comprised of output buffer 196 and input buffer 197. Output buffer 196 delivers the output data to data input/output node N4 in response to the read data read out from a memory cell of memory cell array 101 and then inputs to input node 190c. Input buffer 197 delivers write data to be written in the memory cell of memory cell array 101 to node 190c in response to input data inputted to the data input/output data N4.

Output buffer 196 comprises a N-channel MOS transistor 195n1 connected between source potential node 190a and data input/output node N4, and N-channel MOS transistor 195n2 connected between data input/output node N4 and grounding potential node 190b. Output buffer 196 further comprises data output control circuit 191, 192, and boosting pulse generating circuit 194. In data output control circuit 191, in response to read data read from a memory cell in the memory array and a write/read control signal WO from the write/read control circuit 180, when the write/read control signal WO is at a H level showing a read, N-channel MOS transistor 195n2 becomes non-conductive, if the read data is on a H level of binary level, while N-channel MOS transistor 195n2 becomes conductive, if the read data is on the remaining L level of binary level. On the other hand, when the write/read control signal WO is on L level showing a write, N-channel MOS transistor 195n2 is non-conductive irrespective of the read data. Data output circuit 191 includes a logic circuit 191a.

In data output control circuit 192, in response to read data read from a memory cell in the memory array and a write/read control signal WO from write/read control circuit 180, when the write/read control signal WO is at a H level showing a read, outputs a data output control signal to node N1 so that N-channel MOS transistor 195n2 is non-conductive. Further, the read data must be at a L level of binary level, while the data output control signal is being outputted to node N1 so that N-channel MOS transistor 195n2 is conductive, the read data must remain on a H level of binary level. On the other hand, when the write/read control signal WO is at a L level showing a write, the data output control signal is outputted to the node 1 so that the N-channel MOS transistor 195n2 is non-conductive irrespective of the read data. Data output circuit 191 includes a logic circuit 192a for outputting the data output control signal to node N1 in response to write/read control signal WO and read data.

Further, boosting signal generation circuit 194 receives a data output control signal from data output control circuit 192, and when the data output control signal instructs N-channel MOS transistor 195n1 to be conductive, the gate potential of N-channel MOS transistor 195n1 is raised higher than source potential VCC applied to source potential node 190a to which N-channel MOS transistor 195n1 is connected, and thereby N-channel MOS transistor 195n1 becomes conductive. When the data output control signal instructs N-channel MOS transistor 195n1 to be non-conductive, the gate potential of N-channel MOS transistor 195n1 is lowered to ground potential VSS, and thereby N-channel MOS transistor 195n1 is non-conductive.

Boosting signal generation circuit 194 comprises inversion circuit 192b, N-channel MOS transistor 194n2, boosting capacitor 194c, P-channel MOS transistor 194p1 and N-channel MOS transistor 194n1. Inversion circuit 192b is comprised of inverter 192ba for inverting a data output control signal outputted from data output control circuit 192 and delay circuit 192bb. N-channel MOS transistor 194n2 is diode-connected between source potential node 190a and boosting node 194q so as to be disposed in the forward direction from source potential node 190a to boosting node 194q, and in which gate is connected to a back gate. In the boosting capacitor 194c, one electrode is connected to boosting node 194q, and when the data output control signal, outputted from data output control circuit 192, instructs N-channel MOS transistor 195n1 to be conductive, an inversion and delay signal of the data output control signal outputted from inversion circuit 192b to node N2 boosts the potential of boosting node 194q due to capacity coupling. P-channel MOS transistor 194p1 is connected between boosting node 194q and the gate of N-channel MOS transistor 195n1 and open-circuited when the data output control signal, outputted from data output control circuit 192 to node N1, instructs N-channel MOS transistor 195n1 to be conductive, but non-conductive when the data output control signal, outputted from data output control circuit 192 to node N1, instructs N-channel MOS transistor 195n1 to be non-conductive. N-channel MOS transistor 194n1 is connected between the gate of N-channel MOS transistor 195n1 and ground potential node 190b, and closed-circuited when the data output control signal, outputted from data output control circuit 192 to node N1 instructs N-channel MOS transistor 195n1 to be conductive, but conductive when the data output control signal, outputted from data output control circuit 192 to node N1, instructs N-channel MOS transistor 195n1 to be non-conductive.

Operation of the boosting pulse generation circuit shown in FIG. 5 is hereinafter described with reference to the timing chart of FIG. 6. In FIG. 6, (a) shows potential N190c fluctuation when the read data appearing in input node 190c is at a H level; (b) shows potential fluctuation in write/read control signal WO; (c) shows potential fluctuation in output node N1 of data output circuit 191; (d) shows potential fluctuation in output node N3 of boosting pulse generation circuit 194; (e) shows potential N194q fluctuation in boosting node 194q; and (f) shows potential fluctuation in data input/output node N4.

The boosting pulse generation circuit exhibits an advantage just when the read data from the node N4 is at a H level of binary level. When the read data read from memory cell of memory cell array 101 is at a H level of the binary level as shown in FIG. 6 (a) and write/read control signal WO from write/read control circuit 180 is at a H level showing a read as shown in FIG. 6(b), the potential of node N1 from data output control circuit 192 drops from a H level to a L level. As a result, the potential of node N3 of N-channel MOS transistor 195n1 rises to a potential level of boosting node 194q at that moment, that is, to VCC−|Vth0|.

In this way, N-channel MOS transistor 195n1 is conductive and, as shown in FIG. 6(f), the potential level, in which level of node N4 is going to rise from a high impedance state to a H level, is limited to VCC−|Vth0|−|Vth| because the potential level of the node N3 is VCC−|Vth0|. Thereafter, when the potential fluctuation in node N1 is inverted by inversion circuit 192b and delayed and transmitted to node N3, the potential of boosting node 194q is further boosted from the precharged potential Vcc−|Vth| due to the capacity coupling of capacitor 194c as shown in FIG. 6(e). This boosted potential is then transmitted to node N3 through P-channel MOS transistor 194p1 as shown in FIG. 6(d), and with the rise of the potential on node N3, the potential of output node N4 rises up to VCC as shown in FIG. 6(f). Unless the boosting pulse generation circuit 194 is disposed, the potential rise is limited to VCC−|Vth0|−|Vth|, as indicated by the dotted line in FIG. 6(f).

In the boosting pulse generation circuit mentioned above, it is possible to perform efficient boosting with respect to the source voltage. It is also preferable to employ a P-channel MOS transistor which is diode-connected so as to be disposed in the forward direction from source potential node 194a to first connection node 194q and in which the back gate is connected to a gate, instead of N-channel MOS transistor 194n2 of the boosting pulse generation circuit.

The invention has been described with respect to certain embodiments. Various modifications and additions within the spirit of the invention will occur to those of skill in the art. Accordingly, the scope of the invention is limited solely by the following claims.

What is claimed is:

1. A boosting pulse generating circuit, comprising:
an input terminal receiving an input signal;
a first inverter circuit connected between a first potential node and a second potential node and receiving said input signal;
a second inverter circuit connected between said first potential node and said second potential node through a diode-connected MOS transistor and connected between said input terminal and an output terminal; and
a capacitor connected between an output terminal of said first inverter circuit and a node interconnecting said diode-connected MOS transistor and said second inverter circuit; wherein
a back gate of said MOS transistor is connected to a gate thereof.

2. A boosting pulse generation circuit as set forth in claim 1, wherein said MOS transistor is a P-channel MOS transistor.

3. A boosting pulse generation circuit as set forth in claim 1, wherein said MOS transistor is a N-channel MOS transistor.

4. A boosting pulse generating circuit, comprising:

a first inverter receiving an input signal from an input terminal and an operating voltage from a source of operating potential, and outputting a first inverted signal;

a diode-connected MOS transistor having a back gate and a gate interconnected with each other and one source/drain terminal connected to said operating potential source;

a second inverter receiving said input signal from said input terminal and connected to another source/drain terminal of said diode-connected MOS transistor, and outputting a second inverter signal; and a capacitor charged by said first inverted signal and a signal produced at a node interconnecting said diode-connected MOS transistor and said second inverter.

5. The boosting pulse generating circuit of claim 4, wherein said MOS transistor is a P-channel transistor.

6. The boosting pulse generating circuit of claim 4, wherein said MOS transistor is a N-channel transistor.

7. A dynamic random access memory (DRAM) including a data output control circuit producing a data output control signal, and an input/output buffer having a boosting pulse generating circuit, the boosting pulse generating circuit comprising:

an inversion circuit including, an inverter and delay circuit receiving said data output control signal from said data output control circuit;

a first N-channel MOS transistor connected between a first fixed source potential node and a boosting node;

a boosting capacitor coupled between an output of said inverter and delay circuit and said boosting node; and a second N-channel MOS transistor and a P-channel MOS transistor connected in series with each other between the boosting node and a second fixed potential node;

a back gate of said first N-channel MOS transistor connected to a gate thereof.

8. The boosting pulse generating circuit of claim 7, wherein the first N-channel MOS transistor has a threshold voltage on the order of 0.25V.

* * * * *